(12) United States Patent
Kim et al.

(10) Patent No.: US 6,334,311 B1
(45) Date of Patent: Jan. 1, 2002

(54) THERMOELECTRIC-COOLING TEMPERATURE CONTROL APPARATUS FOR SEMICONDUCTOR DEVICE FABRICATION FACILITY

(75) Inventors: Tae-hoon Kim, Suwon; Byung-chul Kim, Yongin; Young-woo Lee; Tae-ryong Kim, both of Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/511,896

(22) Filed: Feb. 23, 2000

(30) Foreign Application Priority Data

Mar. 5, 1999 (KR) .............................................. 99-7280

(51) Int. Cl.[7] .............................................. F25B 21/02
(52) U.S. Cl. .............................. 62/3.2; 62/3.7; 136/201
(58) Field of Search ........................... 62/3.2, 3.1, 3.7; 136/201, 203, 205; 165/80.2

(56) References Cited

U.S. PATENT DOCUMENTS

| | | | | |
|---|---|---|---|---|
| 5,040,381 A | * | 8/1991 | Hazen | 62/3.2 |
| 5,362,983 A | * | 11/1994 | Yamamura et al. | 257/414 |
| 5,429,680 A | * | 7/1995 | Fuschetti | 136/203 |
| 5,966,939 A | * | 10/1999 | Tauchi | 62/3.2 |
| 6,103,967 A | * | 8/2000 | Cauchy et al. | 136/201 |
| 6,202,000 B1 | * | 3/2001 | Rheem | 700/121 |
| 6,222,113 B1 | * | 4/2001 | Ghoshal | 136/201 |

FOREIGN PATENT DOCUMENTS

| JP | 2-68496 A | * | 3/1990 | 62/3.2 |
|---|---|---|---|---|

* cited by examiner

Primary Examiner—Henry Bennett
Assistant Examiner—Melvin Jones
(74) Attorney, Agent, or Firm—Volentine Francos, PLLC

(57) ABSTRACT

A thermoelectric-cooling temperature control apparatus for a semiconductor device fabrication facility maintains a temperature condition, such as the temperature of a wafer, stable during the fabrication process. The apparatus includes a heat exchanger having a thermoelectric cooling element which produces a Peltier Effect to cause the element to absorb and radiate heat according to current flowing through the element

26 Claims, 7 Drawing Sheets

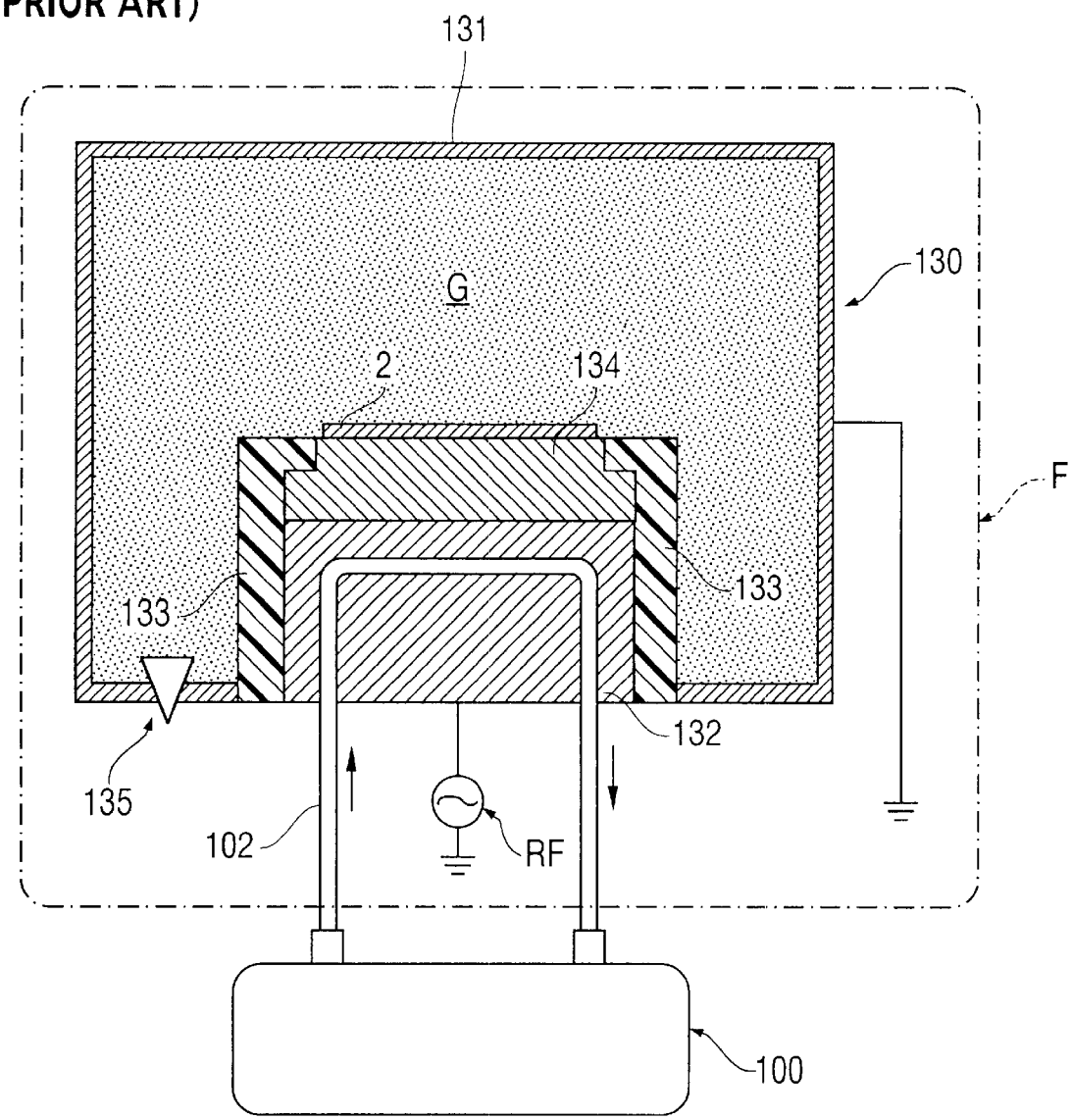

THERMOELECTRIC-COOLING TEMPERATURE CONTROL APPARATUS FOR SEMICONDUCTOR DEVICE FABRICATION FACILITY

BACKGROUND OF THE INVENTION

1. Field of the Invention

The present invention relates to a thermoelectric-cooling temperature control apparatus located in a clean room for maintaining a constant temperature inside a semiconductor device fabrication facility.

2. Description of the Related Art

In general, semiconductor devices are fabricated by executing various processes repeatedly. The conditions in the semiconductor device fabrication facility must be well regulated in order for the fabrication processes to be carried out precisely and efficiently. These conditions include temperature, vacuum pressure, radio frequency power, gas flow rate, etc. However, if any one of the above conditions is not kept stable during the respective process carried out thereunder, productivity is adversely affected, e.g., the production yield, etch rate, uniformity, etc., is reduced.

Recently, wafers having a large diameter(greater than 300 mm) have been used for mass producing highly integrated semiconductor devices. Accordingly, each piece of processing equipment has been adapted for use with such wafers. Also, accessory equipment is required for regulating the process conditions appropriately for the processing of the large wafers.

In particular, the semiconductor device fabrication processes include a dry etch process in which a wafer is etched by activating process gas inside a process chamber, whereby the process gas assumes the state of plasma. In the dry etch process, a certain portion of a layer grown on the wafer is selectively etched by the process gas in a plasma state, using a photoresist as a mask. Dry etching is an important step for fabricating high-capacity and highly integrated semiconductor devices. The types of plasma which are used are referred to as Capacitive Coupled Plasma (CCP) and Inductive Coupled Plasma (ICP).

Capacitive Coupled Plasma is produced by an electric field generated by selectively applying high frequency power to a plurality of electrodes installed inside the process chamber. On the other hand, Inductive Coupled Plasma is produced by magnetic and electric fields respectively generated by selectively applying high frequency power to coils wound around the outside of the process chamber and to a plurality of electrodes installed inside the process chamber. In addition to the dry etch process, plasma is also typically used in a Chemical Vapor Deposition (CVD) process to form a good thin layer on a wafer inside a process chamber.

In the above-described processes for manufacturing semiconductor devices, at least two electrodes are required to form the plasma, and a wafer is mounted on either one of the two electrodes. Most important, though, the process conditions, i.e., process temperature, must be regulated appropriately if the process is to impart the desired characteristics to the semiconductor device. Therefore, a chiller as a heat exchanger is provided outside the semiconductor device fabrication facility for automatically controlling the temperature within the chamber.

The chiller is of critical importance in the dry etch process. The chiller prevents the electrodes (cathode or anode) from overheating during the etch process and maintains the temperature inside the chamber to within a certain temperature range, thereby preventing the dry etch apparatus from malfunctioning due to temperature fluctuations.

FIG. 6 schematically illustrates a chiller (heat exchanger) of a semiconductor device fabrication facility in which plasma is produced.

The semiconductor device fabrication facility (F) includes an electrode 132 provided at the bottom of a chamber 130, a pedestal 134 on top of the electrode 132, and a second electrode 131. The pedestal 134 is provided with the same electric potential as the electrode 132. An electric state chuck (not shown) is incorporated into the pedestal 134 and supports a wafer 2 thereon. The electrode 131 surrounds the electrode 132 and the pedestal 134 to form a sealed space therebetween. An insulator 133 is disposed around the electrode 132 and the pedestal 134 to provide electrical insulation between the electrode 131 and the electrode 132.

In addition, a vacuum port 135 is provided on one side of the electrode 131. The vacuum port 135 is selectively opened to maintain a vacuum in the sealed space. A vacuum pump (not shown) is connected to the vacuum port 135 to create the vacuum in the chamber 130. A gas supply line (not shown) is open at one side of the chamber 130 to fill the sealed space with process gas. A high frequency power source (RF) is connected to the bottom of the electrode 132, and the electrode 131 is connected to ground.

As the vacuum pump is operated to produce a high vacuum state in the chamber 130, process gas fills the sealed space of the chamber 130. The wafer 2 is processed by the process gas when high frequency power is applied to the electrode 132, and the process gas is transformed into plasma by the resultant electric field.

A coolant circulation line 102 extends through the electrode 132, on which the wafer 2 is mounted, or through the pedestal 134 to directly control the temperature of the wafer 2. The coolant is circulated through the line 102 with constant fluid pressure and fluid quantity while being cooled (or heated) by a chiller 100. The coolant may be an inert solution consisting of deionized water, an immobile solution diluted at a constant rate, or a Fluorinert solution such as a colorless and odorless Fluoro Carbon solution.

The chiller 100 provides a typical cooling cycle. The chiller 100 comprises a compressor to transform gas coolant at a low temperature and low pressure to gas coolant having a high temperature and high pressure, a condenser to transform the gas coolant having a high temperature and high pressure to fluid coolant at room temperature and having a high pressure, an expander to transform the fluid coolant at room temperature and high pressure to fluid coolant having a low temperature and low pressure, and an evaporator to absorb heat from the outside while transforming the fluid coolant at low temperature and low pressure to gas. With the operation of the compressor, the coolant is successively compressed and evaporated so that the coolant, in turn, radiates and absorbs heat. The cooled (or heated) coolant circulating through the coolant circulation line 102 passes through the inside of the electrode 132 so that a heat exchange is effected.

As described above, a temperature controlling apparatus (chiller) is disposed outside the semiconductor device fabrication facility F in which the wafer 2 is processed. The chiller 100 thus occupies a large amount of otherwise free space, and contributes to the expense necessary for maintaining the clean room in which the semiconductor fabrication facility is provided. Moreover, although the conventional chiller 100 is installed adjacent to the semiconductor device fabrication facility F to minimize the temperature losses, such temperature losses are inevitable because the coolant is circulated to and from the facility via the coolant circulation line 102. These temperature losses become especially significant when large-diametered wafers are processed because the chiller 100 must have a large cooling capacity in this case. Moreover, such a large chiller 100 requires so much space inside a clean room that a significant part of the cost associated with building the clean room can be attributed to the space necessary for accommodating the chiller.

In addition, any problem with the operation of the chiller 100 destabilizes the temperature of the wafer 2, thereby causing failures in the processing of the wafer 2. Also, the leakage of coolant adversely affects the chips on the wafer, thereby decreasing production yield and contaminating the clean room environment.

In addition, because the chiller 100 comprises a compressor, a condenser, an expander, and an evaporator, etc., the chiller requires a large amount of maintenance and hence, the expense associated therewith. Furthermore the chiller produces a serious amount of noise, and thus is deleterious to the work environment.

SUMMARY OF THE INVENTION

A first object of the present invention is to provide a heat exchanger which effects an efficient and precise amount of heat exchange with a thermal load, so as to be useful in a temperature control apparatus.

To achieve this object the present invention provides a thermoelectric element comprising a P-type semiconductor and an N-type semiconductor spaced apart from one another, a first electrical conductor comprising a negative electrode attached to one end of the P-type semiconductor and a positive electrode attached to one end of the N-type semiconductor, a second electrical conductor attached to the other ends of the semiconductors, and lower and upper electrically insulating thermoconductors attached to outer sides of the first and second conductors, respectively, thereby electrically insulating the conductive elements.

The thermoelectric element may comprise several pairs of the P-type and N-type semiconductors. In this case, the pairs are electrically connected to one another in series and/or parallel.

Another object of the present invention is to provide a thermoelectric-cooling temperature control apparatus for a semiconductor device fabrication facility which obviates one or more of the problems, limitations and disadvantages of the prior art.

In this respect, one specific object of the present invention is to provide a heat exchanger for a semiconductor device fabrication facility, which is disposed in the semiconductor device fabrication facility itself so as to not occupy space in the clean room.

Another specific object of the present invention is to provide a temperature control apparatus for a semiconductor device fabrication facility, which reliably maintains the temperature of a wafer stable during a fabrication process, and thereby enhances the yield of semiconductor devices.

Still another object of the present invention is to provide a temperature control apparatus for a semiconductor device fabrication facility, which has a simple structure, is compact and light-weight, and can be operated continuously for a long period of time without being maintained.

A still further object of the present invention is to provide a temperature control apparatus for a semiconductor device fabrication facility which is unlikely to contaminate the facility or the clean room in which the facility is disposed.

Still another object of the present invention is to provide a temperature control apparatus for a semiconductor device fabrication facility, which is inexpensive to maintain.

Another object of the present invention is to provide a temperature control apparatus for a semiconductor device fabrication facility, which produces little noise and thereby helps maintain a safe work environment.

Still another object of the present invention is to provide a thermoelectric-cooling temperature control apparatus for a semiconductor device fabrication facility which has a heat exchanger that can effect a large amount of heat transfer, and yet is easy to assemble to the facility, disassemble from the facility, to fix and to replace.

To achieve these objects, the present invention provides a temperature control apparatus having a heat exchanger disposed in a heat exchange relationship with the wafer support of the semiconductor device fabrication facility, the heat exchanger comprising a thermoelectric cooling element producing a Peltier Effect which causes the thermoelectric element to absorb and radiate heat according to the amount of current flowing through parts of the conductors in contact with each other.

A controller, such as a microprocessor, controls the amount of current supplied by a power source to the conductors of the thermoelectric cooling element, whereby the amount of heat exchange is controlled.

The heat exchanger can include heat radiation means to effect a final heat exchange outside of the processing chamber of the semiconductor device fabrication facility.

BRIEF DESCRIPTION OF THE DRAWINGS

These and other objects, features and advantages of the present invention will become more clear from the following detailed description of preferred embodiments thereof made with reference to the accompanying drawings, of which:

FIG. 6 is a schematic sectional view of a semiconductor device fabrication facility having a conventional heat exchanger.

DETAILED DESCRIPTION OF THE PREFERRED EMBODIMENTS

Figure 1:
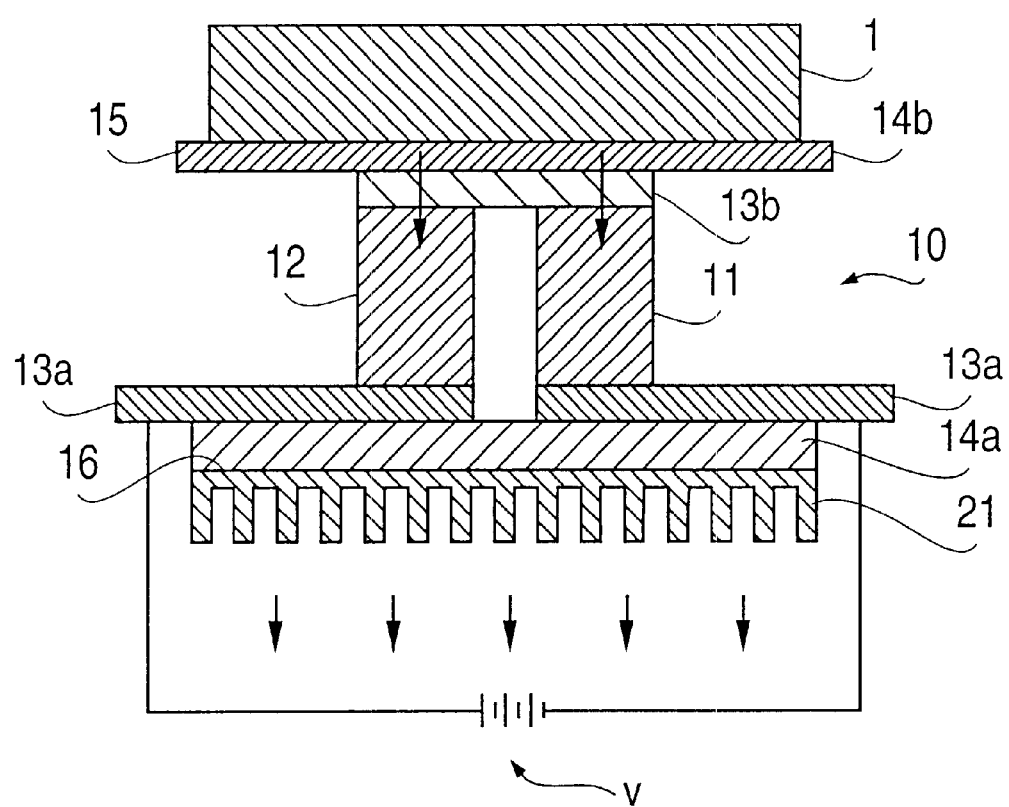
FIG. 1 is a schematic sectional view of a one-story thermoelectric cooling element according to the present invention.

Preferred embodiments of the present invention will now be described in detail with reference to the accompanying drawings.

First, however, the general principle behind the present invention will be explained. In general, if two kinds of conductors (different metals) are connected, and current is supplied through the parts of the conductors in contact with each other, one of the contacting parts of the conductors absorbs heat and the other radiates heat depending on the direction of the current. This phenomena is known as the Peltier Effect. When the heat of a specific object is absorbed using the Peltier Effect, the method is referred to as Thermoelectric Cooling. The heat absorbed is proportional to the thermoelectric capacity of the device, which is based on the current supplied to the conductors, the absolute temperature of the environment in which the device is operated, and the characteristics of the conductors.

On the hand, if the contacting parts of the two conductors (different kinds of metals) are at different temperatures, an electromotive force is generated in one direction. The production of such an electromotive force by a temperature difference at two contacting parts of conductors is called the Seebeck Effect. The Seebeck Effect has been put to practical use in devices for measuring temperature, such as in a device for measuring the temperature of a furnace.

Instruments which use the above-described phenomena are all generally referred to as thermoelectric cooling elements. Examples of such thermoelectric cooling elements include a thermistor, a Seebeck Element which uses the Seebeck phenomenon to generate an electromotive force, and a Peltier Element which uses the Peltier phenomenon to absorb and radiate heat.

The thermistor is a semiconductor device in which its electric resistance changes according to the temperature. Thermistors are made of oxides, such as Mo, Ni, Co, Fe, which are sintered, and are used in stabling circuits, and devices for detecting heat and power, etc. In the past, Negative Temperature Coefficient Thermistors, in which the electric resistance decreases as the temperature increases, were widely used. Recently, Positive Temperature Coefficient Thermistors, in which the electric resistance increases as the temperature decreases, are being used. In addition, a Critical Temperature Resistor (CTR) is also known. This resistor uses a Negative Temperature Coefficient Thermistor to change its electric resistance at a specific temperature.

In the meantime, the Peltier Effect is produced more efficiently when semiconductors, such as Bi (Bismuth) and Te (Tellurium), having different electric conductivities are used instead of metal conductors. With semiconductor elements it is possible to precisely control the quantity of absorbed/ radiated heat according to the current. Accordingly, when a Peltier element made up of semiconductor materials is used as a thermostat, the thermostat will exhibit a quick-response and precision even at around room temperature.

With the above in mind, Applicants have found it preferable to use a P-type semiconductor and a N-type semiconductor in a heat exchanger of a semiconductor device fabrication facility, to provide a heat exchanger which uses the Peltier Effect to its maximum extent in effecting heat transfer. The heat exchanger has an arrangement as follows: a "+" electrode, an N-type semiconductor, a middle electrode, a P-type semiconductor, and a "−" electrode. The heat exchange is effected by supplying current through the electrodes, whereby the outer electrodes act as a radiation source and an absorption source.

Figure 2:
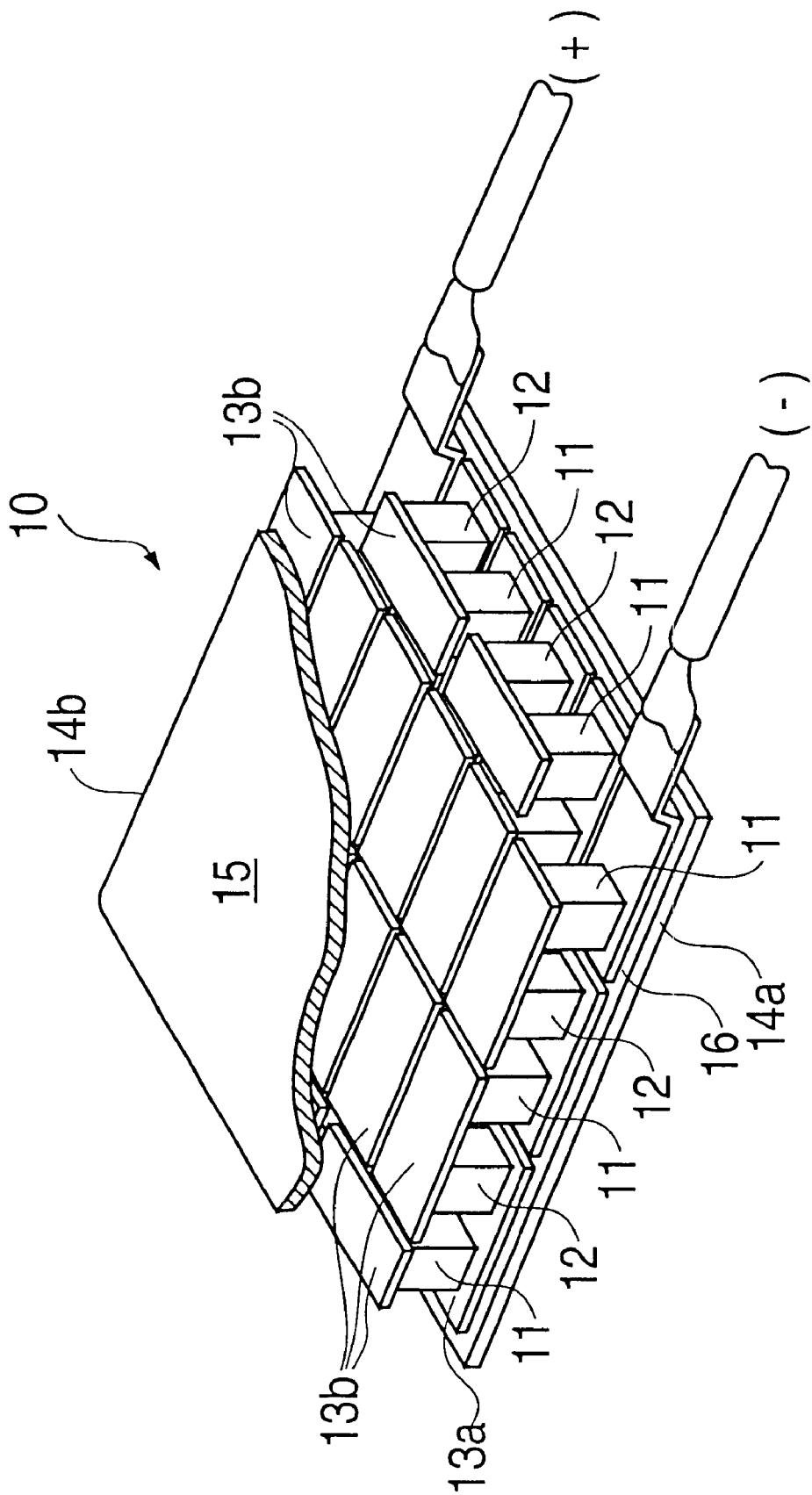
FIG. 2 is a partially broken away perspective view of the one-story thermoelectric cooling device according to the present invention.

FIGS. 1 and 2 show the structure of a heat exchanger of a thermoelectric-cooling temperature control apparatus in the form of a thermoelectric cooling element 10 operating under the principle described above according to the present invention. FIG. 1 shows the one-story structure of the thermoelectric cooling element 10 in section, and FIG. 2 shows the one-story structure of the thermoelectric cooling element 10 in perspective.

As shown in the drawings, the single thermoelectric cooling element 10 comprises a P-type semiconductor 11 and a N-type semiconductor 12, which are aligned in parallel, a first conductor 13a including a "−" electrode and a "+" electrode attached to first ends of the P-type semiconductor 11 and N-type semiconductor 12, respectively, a second conductor 13b which is attached to the second ends of the P-type semiconductor 11 and the N-type semiconductor 12 and electrically connect them, lower and upper electrically insulating thermoconductors 14a and 14b which are attached to outer sides of the first and second conductors 13a and 13b, respectively, and a power source V connected in a closed circuit with the conductors 13a, 13b and semiconductors 11, 12.

More specifically, the power source V is connected between the electrodes of the first conductor 13a. Accordingly, current flows sequentially through the "+" electrode of the first conductor 13a, the N-type semiconductor 12, the second conductor 13b, the P-type semiconductor 11, and the "−" electrode of the first conductor 13a. The flow of the current produces a Peltier Effect above and below the insulating thermoconductors 14a and 14b, i.e., the outer surface 15 of the upper insulating thermoconductor 14 is a cooling surface, and the outer surface 16 of the lower insulating thermoconductor 14 is a warming surface.

At this time, the P-type semiconductor 11 possessing a shortage of electrons has a low energy level, whereas the N-type semiconductor 12 possessing excess electrons has a high energy level. The flow of electrons, i.e., the movement of the thermoelectric carrier, transfers the heat energy absorbed. In other words, if a power source object 1 mounted on the cooling surface 15 of the upper insulating thermoconductor 14b is loaded, heat generated from the power source object 1 is absorbed and transmitted to the lower insulating thermoconductor 14a, so that the temperature of the power source object 1 can be regulated. A heat radiation plate 21 having a plurality of fins is provided on the outer surface 16 of the lower insulating thermoconductor 14a to radiate the heat transmitted thereto, thereby enhancing the heat transfer.

FIG. 2 shows a high capacity thermoelectric cooling element 10 of the present invention, which has a series of conductors and semiconductors coupled to one. Pairs of the P-type 11 and N-type 12 semiconductors are aligned with one another along a zig-zagging path, and the P-type semiconductor 11 of each pair of semiconductors is connected by a common electrode of the first conductor 13a to the N-type semiconductor 12 of a pair of semiconductors adjacent thereto with respect to the path along which the pairs are aligned. The plurality of pairs of the P-type 11 and N-type 12 semiconductors are thus electrically connected in series.

The first conductor 13a also has two terminals, constituted by "−" and "+" electrodes, to which the electric power source is connected. The lower and upper thermoconductors 14a and 14b have the form of plates and are attached to the outer sides of the first and second conductors 13a and 13b, respectively. The conductors 13a and 13b comprise metal plates or wires exhibiting good electrical conductivity.

Figure 3:
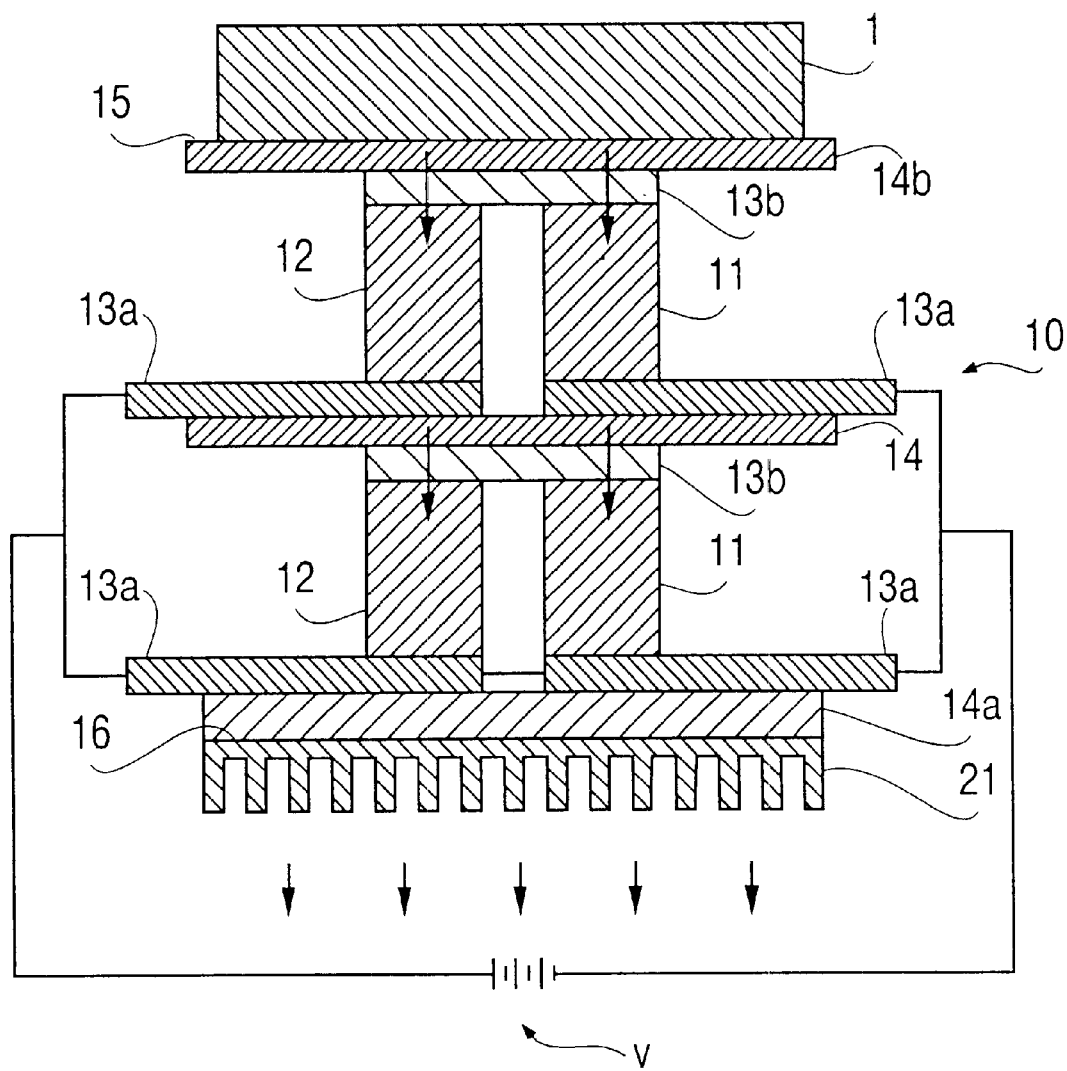
FIG. 3 is a schematic sectional view of a multi-storied thermoelectric cooling element according to the present invention.

FIG. 3 shows another embodiment of the thermoelectric cooling element 10 of the present invention. In this embodiment, the thermoelectric cooling element 10 has a multi-storied structure in which individual thermoelectric cooling units are stacked one upon the other and are electrically connected in parallel. Each of the cooling units can include pairs of semiconductors connected in series, as in the embodiment of FIG. 2.

A power source V supplies a certain amount of power to the terminals of the lower conductor 13a of each thermoelectric cooling unit. One insulating thermoconductor 14 is located between the stories and thus provides both a cooling and warming surface at the same time, thereby channeling the heat in one direction.

Figure 4A:
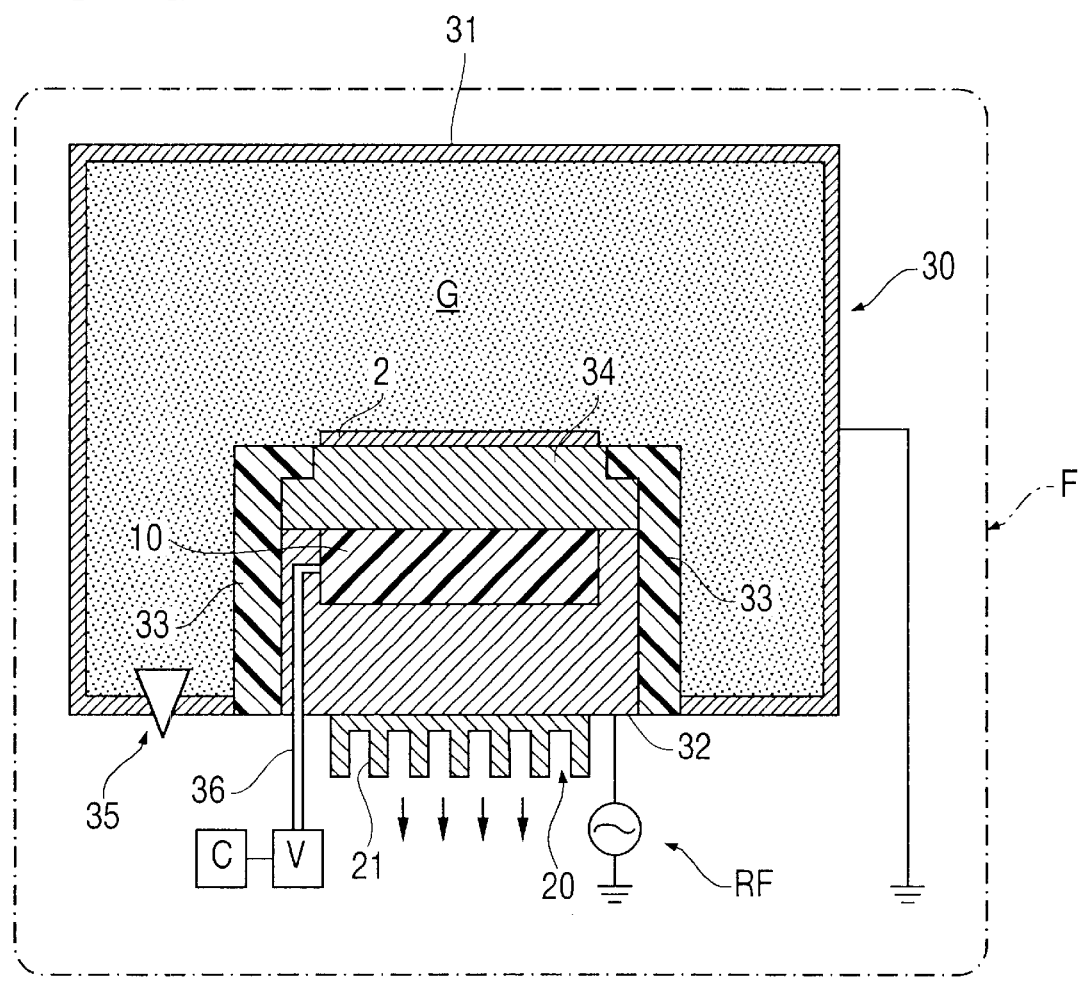
FIG. 4a is schematic sectional view of a semiconductor fabrication facility having a first embodiment of a thermoelectric cooling temperature apparatus according to the present invention.
Figure 4B:
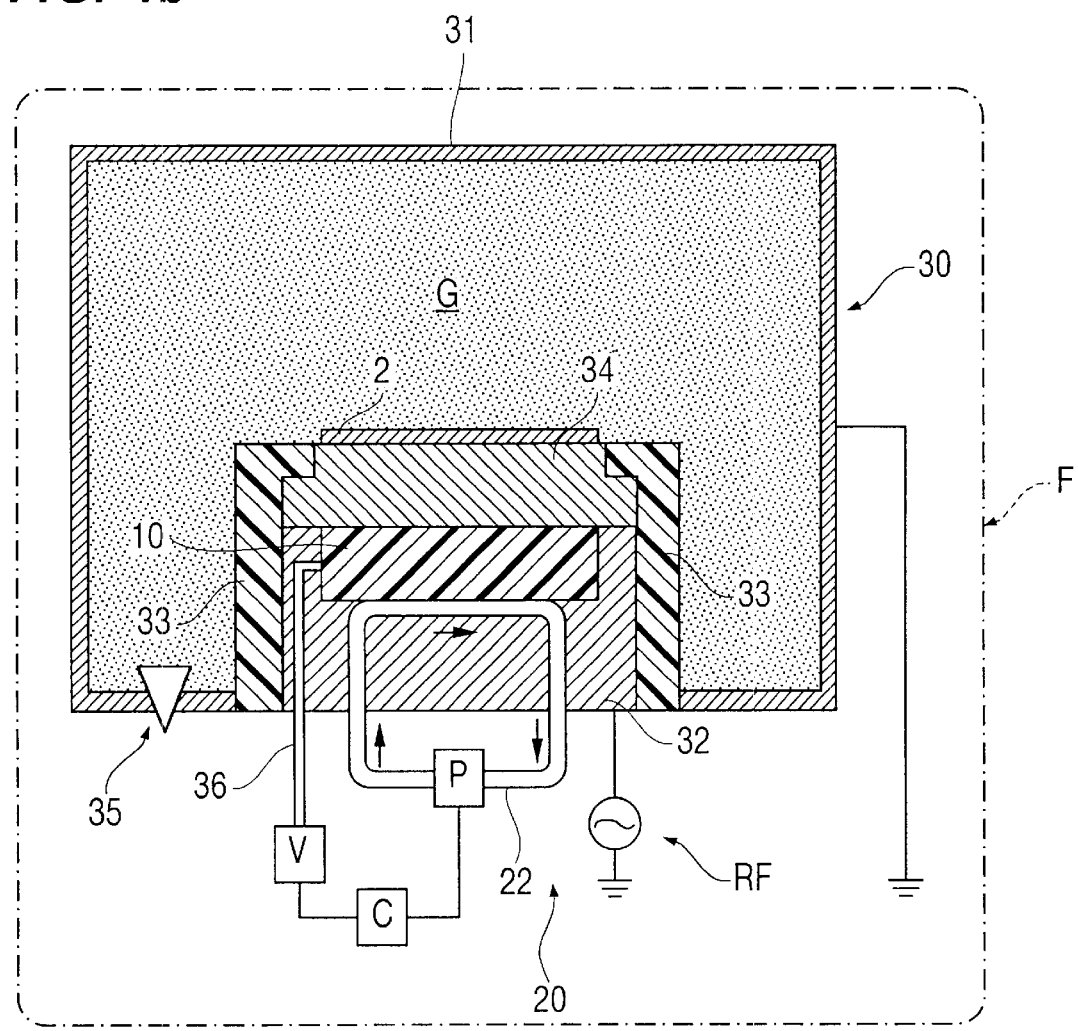
FIG. 4b is schematic sectional view of a semiconductor fabrication facility having a second embodiment of a thermoelectric cooling temperature apparatus according to the present invention.
Figure 5:
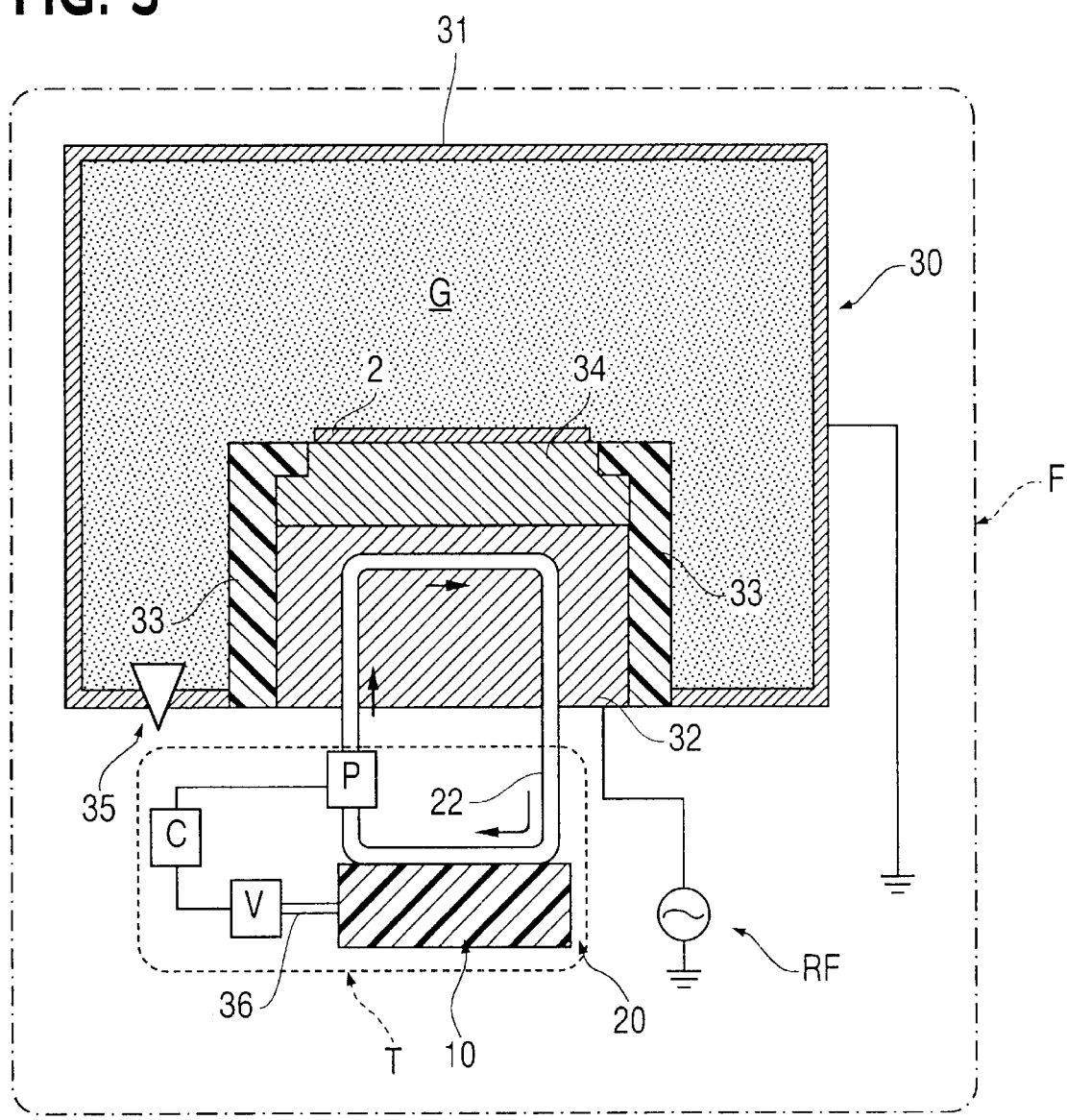
FIG. 5 is schematic sectional view of a semiconductor fabrication facility having a third embodiment of a thermoelectric cooling temperature apparatus according to the present invention.

Now, various embodiments of a thermoelectric-cooling temperature control apparatus for use with a semiconductor device fabrication facility, and comprising the thermoelectric cooling element 10 according to the present invention, will be described with reference to FIGS. 4a to 5. FIGS. 4a and 4b show embodiments of the thermoelectric cooling temperature apparatus each for use with a mid-size semiconductor device fabrication facility F. FIG. 5 shows an embodiment of the thermoelectric-cooling temperature control apparatus for use with a large semiconductor device fabrication facility F. Any of the thermoelectric elements 10 shown in FIGS. 1–3 can be used in the embodiments of FIGS. 4a, 4b and 5.

The semiconductor device fabrication facility F can be of any type having a a chamber 30 in which a process is carried out on a wafer 2. For example, the facility can be of the type that performs a plasma etch process to selectively remove a certain portion of a thin layer formed on the wafer 2, or performs a Chemical Vapor Deposition process to form a thin layer over the wafer 2. The thermoelectric-cooling temperature control apparatus of the present invention comprises a heat exchanger using the Peltier Effect to exchange heat with the wafer support in order to maintain the temperature of the wafer within a certain range. The heat exchanger is installed adjacent to the electrode 32 on which the wafer 2 is mounted.

In such semiconductor device fabrication facilities F, as shown in the drawings, the electrode 32 is provided at the bottom of a process chamber 30. A pedestal 34 having an electric state chuck (not shown) provided with the same voltage as the electrode 32 is disposed on the electrode 32. An electrode 31 surrounds the electrode 32 and the pedestal 34 and provides a sealed space therewithin. An insulator 33 extends around the electrode 32 and the pedestal 34 to provide electric insulation between the electrode 31 and the electrode 32. In addition, a vacuum port 35 and a vacuum pump (not shown) connected thereto maintain a vacuum in the sealed space. Process gas is supplied to the chamber 30 through a gas supply line (not shown) open to the chamber 30 at one side thereof. A high frequency power source RF is connected to the bottom of the electrode 32, and the electrode 31 is grounded.

The vacuum pump induces process gas into the sealed space of the chamber 30. The process gas is converted to plasma G by an electric field generated when high frequency power is supplied to the electrode 32 by the power source RF.

In the embodiments of FIGS. 4a and 4b, the heat exchanger comprises a thermoelectric cooling element 10 disposed inside the electrode 32 and just below the pedestal 34 to which the wafer 2 is mounted. A power source V supplies power to the thermoelectric cooling element 10 via a power supply cable 36. A controller C comprising a microprocessor is connected to the power source V to control the amount of power that the power source V supplies to the thermoelectric cooling element 10, whereby the amount of heat exchange which is effected by the thermoelectric cooling element 10 can be controlled. The upper and lower insulating members of the thermoelectric cooling element 10 electrically insulates the electrode 32 from the pedestal 34.

The heat exchanger comprises heat radiation means 20 for exchanging heat with the environment outside the chamber 30. In the embodiment of FIG. 4a, the heat radiation means 20 is a heat radiation plate 21 having a plurality of fins. On the other hand, in the embodiment of FIG. 4b, the heat radiation means is a coolant circulation line 22 passing through the inside of the electrode 32.

In the embodiment of FIG. 4b, a pump P is connected to the cooling water circulation line 22 to forcibly circulate the coolant therethrough. The pump P is controlled by the controller C. Deionized water is preferably used as a coolant as it will cause the least harm to the semiconductor device fabrication facility F should it leak from the line. However, other suitable liquid or gas coolants can be used. The power supplied to the thermoelectric cooling element 10 and the rate at which the pump P is operated are controlled by the microprocessor of the controller C so that a heat exchange most appropriate for the process being carried out by the semiconductor fabrication facility F is effected.

FIG. 5 shows an embodiment of a thermoelectric-cooling temperature control apparatus in which the heat radiation means 20 comprises a thermoelectric cooling element 10 attached to a coolant circulation line 22 outside the chamber 30.

The coolant circulation line 22 passes through the inside of the electrode 32, and coolant is forcibly circulated in the line 22 through the electrode 32 and past the thermoelectric cooling element 10 by a pump P, whereby a heat exchange is effected. The rate of operation of the pump P is controlled by a controller C.

The pump P, controller C, power supply V, power supply cable 36, and thermoelectric element 10 are packaged as a module referred to as a thermoelectric cooling control unit T. The outside of the thermoelectric cooling control unit T is protected with an insulating film and an insulating layer (not shown) to insulate the thermoelectric cooling element 10.

In this embodiment, the integrated thermoelectric cooling control unit is mounted to the outside of the chamber 30 by connecting it to the electrode 32 via the coolant circulation line 22. The microprocessor of the controller C controls the power supplied to the thermoelectric cooling element 10 and the rate of operation of the pump P to effect a rapid heat appropriate for maintaining a temperature condition of the process being carried out in the chamber 30. This embodiment is suitable for a large facility because of the extra space the clean room would have for accommodating the thermoelectric cooling element 10 outside the facility.

As described above, the thermoelectric-cooling temperature control apparatus for use with a semiconductor device fabrication facility according to the present invention is installed inside the facility so that the size of a clean room and the expense associated with building the clean room are minimized. Also, the temperature of the wafer is stably maintained during the semiconductor device fabrication process, whereby productivity and the production yield are enhanced.

Moreover, compared to a conventional cooling apparatus having a compressor, the thermoelectric cooling apparatus of the present invention has a simpler structure, and is more compact and light-weight. Furthermore, the thermoelectric cooling apparatus can run for a longer time without malfunctioning, is easier to maintain, and produces less heat loss.

In addition, the present invention can obviate the use of coolant, or at the very least is less likely to leak coolant when a coolant circulation system is employed. That is, when a coolant circulation system is used, the coolant need only be under enough pressure so as to be forcibly circulated in the coolant circulation line. Compare this to the prior art in which the cooling cycle requires the coolant to be compressed by a compressor. Accordingly, the present invention is more environment friendly, i.e., it is less likely to contaminate the clean room and requires fewer consumables.

The safety and efficiency of workers is also enhanced because of the present invention produces little or no noise during operation.

Finally, because the present invention can be packaged as a module, the present invention can be easily assembled to and disassembled from the semiconductor device fabrication facility, and is readily serviceable for repair or replacement.

Although the present invention has been described in detail above, various changes, substitutions and alterations can be made thereto without departing from the spirit and scope of the invention as defined by the appended claims.

What is claimed is:

1. The combination of a semiconductor device fabrication facility and a thermoelectric-cooling temperature control apparatus for controlling a temperature condition established in the facility during a process of fabricating a semiconductor device, wherein said semiconductor fabrication facility has a processing chamber, and a semiconductor wafer support disposed in the processing chamber for supporting a wafer to be processed, and said temperature control apparatus comprises a heat exchanger disposed in a heat exchange relationship with said wafer support, the heat exchanger comprising a thermoelectric cooling element including two dissimilar electrical conductors in contact with each other, and a power source connected to said conductors so as to supply electric current therethrough, whereby a Peltier Effect is produced which causes the thermoelectric element to absorb and radiate heat according to the amount of current flowing through parts of the conductors in contact with each other.

2. The combination of claim 1, wherein said semiconductor fabrication facility is a dry etching apparatus.

3. The combination of claim 1, wherein said semiconductor fabrication facility is a Chemical Vapor Deposition apparatus.

4. The combination of claim 1, wherein the wafer support of said semiconductor fabrication facility includes an electrode, and the heat exchanger of said temperature control apparatus extends inside of the electrode.

5. The combination of claim 1, wherein the wafer support of said semiconductor fabrication facility comprises a pedestal to which a wafer is mounted, and an electrode disposed under said pedestal, and the thermoelectric cooling element of said temperature control apparatus is disposed inside the electrode, and wherein said temperature control apparatus further comprises a controller operatively connected to said power supply so as to control the amount current supplied to the thermoelectric cooling element by said power source.

6. The combination of claim 5, wherein said heat exchanger further comprises heat radiation means for radiating heat to the outside of said processing chamber.

7. The combination of claim 6, wherein said heat radiation means comprises a heat radiation plate having a plurality of fins, said heat radiation plate being disposed in contact with said electrode.

8. The combination of claim 6, wherein said heat radiation means comprises a coolant circulation line extending along one side of said thermoelectric cooling element, and said temperature control apparatus further comprises a pump connected to said coolant circulation line so as to force coolant to flow along the coolant circulation line.

9. The combination of claim 5, wherein said thermoelectric cooling element comprises:
a P-type semiconductor and an N-type semiconductor spaced apart from one another;
a first electrical conductor comprising a negative electrode attached to one end of said P-type semiconductor and a positive electrode attached to one end of said N-type semiconductor, the first electrical conductor having an outer side facing away from the semiconductors;
a second electrical conductor attached to the other ends of said P-type semiconductor and said N-type semiconductor so as to electrically connect the semiconductors, the second electrical conductor having an outer side facing away from the semiconductors; and
lower and upper electrically insulating thermoconductors attached to the outer sides of said first and second conductors, respectively, thereby electrically isolating a conductive path that extends sequentially through the positive electrode of said first conductor, the N-type semiconductor, the second conductor, the P-type semiconductor, and the negative electrode of said first conductor.

10. The combination of claim 9, wherein said upper electrically insulating thermoconductor is disposed adjacent a thermal load in said processing chamber, and said heat exchanger comprises a heat radiation plate having a plurality of fins disposed near said lower electrically insulating thermoconductor.

11. The combination of claim 9, wherein said thermoelectric cooling element comprises:
a plurality of pairs of semiconductors, each of said pairs comprising a P-type semiconductor and an N-type semiconductor spaced apart from one another, and the pairs of semiconductors being aligned with one another along a path;
a first electrical conductor comprising a negative terminal attached to a said P-type semiconductor of the first one of said pairs of semiconductors disposed along said path, a positive terminal attached to the N-type semiconductor of a last one of said pairs of semiconductors disposed along said path, and a plurality of electrodes each attached to one end of the N-type semiconductor of a respective said pair of semiconductors and to one end of the P-type semiconductor of the pair of semiconductors disposed adjacent thereto along said path, the first electrical conductor having an outer side facing away from said semiconductors;
a second electrical conductor comprising a plurality of electrodes each attached to the other ends of a said P-type semiconductor and a said N-type semiconductor of a respective said pair of the semiconductors so as to electrically connect the semiconductors of said respective pair, the second electrical conductor having an outer side facing away from the semiconductors; and
lower and upper electrically insulating thermoconductors attached to the outer sides of said first and second conductors, respectively, thereby electrically isolating a conductive path that extends from said negative terminal, in series through the pairs of semiconductors, and to said positive terminal; and wherein said electrical power source is electrically connected to the positive and negative terminals of said first conductor so that a closed series circuit coincident with said conductive path is formed.

12. The combination of claim 9, wherein the thermoelectrical cooling element comprises:
a plurality of thermoelectric units stacked one upon the other, each of said thermoelectric units comprising
a P-type semiconductor and an N-type semiconductor spaced apart from one another,
a first electrical conductor comprising a negative electrode attached to one end of said P-type semiconductor and a positive electrode attached to one end of said N-type semiconductor, and
a second electrical conductor attached to the other ends of said P-type semiconductor and said N-type semiconductor so as to electrically connect the semiconductors; and
a lower, at least one middle and an upper electrically insulating thermoconductor, the lower thermoconductor being attached to the first conductor of a lowermost one of said thermoelectric units at an outer side thereof that faces away from the semiconductors thereof, each said middle thermoconductor being interposed between a respective adjacent pair of the thermoelectric units and attached to the second conductor and to the first conductor of the adjacent thermoelectric units, and the upper thermoconductor being attached to the second conductor of an uppermost one of said thermoelectric units at an outer side thereof that faces away from the semiconductors thereof, whereby the electrically insulating thermoconductors electrically isolate a plurality of parallel conductive paths each extending sequentially through the positive electrode of said first conductor, the N-type semiconductor, the second conductor, the P-type semiconductor, and the negative electrode of said first conductor of a respective said thermoelectric unit; and
wherein said electrical power source is electrically connected to the positive and negative electrodes of said first conductor of each of said thermoelectric units so that a closed circuit coincident with said parallel conductive paths is formed.

13. The combination of claim 1, wherein the wafer support of said semiconductor fabrication facility heat exchanger comprises a pedestal to which a wafer is mounted, and an electrode disposed under said pedestal, said heat exchanger comprises heat radiation means for transferring heat from the wafer support to the outside of said processing chamber, and said thermoelectric cooling element is located outside of said processing chamber in a heat exchange relationship with said heat radiation means, and
wherein said temperature control apparatus further comprises a power cable connecting said power source to said thermoelectric unit, and a controller operatively connected to said power source so as to control the amount of current that the power source supplies to said thermoelectric element, thereby controlling the amount of heat exchange that is effected between the heat radiation means and the thermoelectric element.

14. The combination of claim 13, wherein the heat radiation means comprises a coolant circulation line having one portion extending through said electrode and another portion extending alongside said thermoelectric cooling element, and
wherein said temperature control apparatus further comprises a pump connected to said coolant circulation line so as to force coolant to flow along said line.

15. The combination of claim 14, wherein said controller is operatively connected to said pump so as to control the rate at which the pump operates.

16. The combination of claim 13, wherein said thermoelectric cooling element, said power source, said power supply cable and said controller are packaged integrated together as a module.

17. The combination of claim 13, wherein the thermoelectric cooling element comprises:
a P-type semiconductor and an N-type semiconductor spaced apart from one another;
a first electrical conductor comprising a negative electrode attached to one end of said P-type semiconductor and a positive electrode attached to one end of said N-type semiconductor, the first electrical conductor having an outer side facing away from the semiconductors;
a second electrical conductor attached to the other ends of said P-type semiconductor and said N-type semiconductor so as to electrically connect the semiconductors, the second electrical conductor having an outer side facing away from the semiconductors; and
lower and upper electrically insulating thermoconductors attached to the outer sides of said first and second conductors, respectively, thereby electrically isolating a conductive path that extends sequentially through the positive electrode of said first conductor, the N-type semiconductor, the second conductor, the P-type semiconductor, and the negative electrode of said first conductor.

18. The combination of claim 13, wherein the thermoelectric cooling element comprises:
a plurality of pairs of semiconductors, each of said pairs comprising a P-type semiconductor and an N-type semiconductor spaced apart from one another, and the pairs of semiconductors being aligned with one another along a path;
a first electrical conductor comprising a negative terminal attached to a said P type semiconductor of the first one of said pairs of semiconductors disposed along said path, a positive terminal attached to the N-type semiconductor of a last one of said pairs of semiconductors disposed along said path, and a plurality of electrodes each attached to one end of the N-type semiconductor of a respective said pair of semiconductors and to one end of the P-type semiconductor of the pair of semiconductors disposed adjacent thereto along said path, the first electrical conductor having an outer side facing away from said semiconductors;
a second electrical conductor comprising a plurality of electrodes each attached to the other ends of a said P-type semiconductor and a said N-type semiconductor of a respective said pair of the semiconductors so as to electrically connect the semiconductors of said respective pair, the second electrical conductor having an outer side facing away from the semiconductors; and
lower and upper electrically insulating thermoconductors attached to the outer sides of said first and second conductors, respectively, thereby electrically isolating a conductive path that extends from said negative terminal, in series through the pairs of semiconductors, and to said positive terminal; and
wherein said electrical power source is electrically connected to the positive and negative terminals of said first conductor so that a closed series circuit coincident with said conductive path is formed.

19. The combination of claim 13, wherein the thermoelectric cooling element comprises:
a plurality of thermoelectric units stacked one upon the other, each of said thermoelectric units comprising
a P-type semiconductor and an N-type semiconductor spaced apart from one another,
a first electrical conductor comprising a negative electrode attached to one end of said P-type semiconductor and a positive electrode attached to one end of said N-type semiconductor, and
a second electrical conductor attached to the other ends of said P-type semiconductor and said N-type semiconductor so as to electrically connect the semiconductors; and
a lower, at least one middle and an upper electrically insulating thermoconductor, the lower thermoconductor being attached to the first conductor of a lowermost one of said thermoelectric units at an outer side thereof that faces away from the semiconductors thereof, each said middle thermoconductor being interposed between a respective adjacent pair of the thermoelectric units and attached to the second conductor and to the first conductor of the adjacent thermoelectric units, and the upper thermoconductor being attached to the second conductor of an uppermost one of said thermoelectric units at an outer side thereof that faces away from the semiconductors thereof, whereby the electrically insulating thermoconductors electrically isolate a plurality of parallel conductive paths each extending sequentially through the positive electrode of said first conductor, the N-type semiconductor, the second conductor, the P-type semiconductor, and the negative electrode of said first conductor of a respective said thermoelectric unit; and
wherein said electrical power source is electrically connected to the positive and negative electrodes of said first conductor of each of said thermoelectric units so that a closed circuit coincident with said parallel conductive paths is formed.

20. A thermoelectric cooling element comprising:
a plurality of pairs of semiconductors, each of said pairs comprising a P-type semiconductor and an N-type semiconductor spaced apart from one another, and the pairs of semiconductors being aligned with one another along a path;
a first electrical conductor comprising a negative terminal attached to a said P type semiconductor of the first one of said pairs of semiconductors disposed along said path, a positive terminal attached to the N-type semiconductor of a last one of said pairs of semiconductors disposed along said path, and a plurality of electrodes each attached to one end of the N-type semiconductor of a respective said pair of semiconductors and to one end of the P-type semiconductor of the pair of semiconductors disposed adjacent thereto along said path, the first electrical conductor having an outer side facing away from said semiconductors;
a second electrical conductor comprising a plurality of electrodes each attached to the other ends of a said P-type semiconductor and a said N-type semiconductor of a respective said pair of the semiconductors so as to electrically connect the semiconductors of said respective pair, the second electrical conductor having an outer side facing away from the semiconductors; and
lower and upper electrically insulating thermoconductors attached to the outer sides of said first and second conductors, respectively, thereby electrically isolating a conductive path that extends from said negative terminal, in series through the pairs of semiconductors, and to said positive terminal.

21. The thermoelectric cooling element of claim 20, and further comprising a heat radiation plate having a plurality of fins attached to said lower thermoconductor on a side thereof facing away from said first conductor.

22. The thermoelectric cooling element of claim 20, and further comprising an electrical power source electrically connected to the positive and negative terminals of said first conductor so that a closed series circuit coincident with said conductive path is formed.

23. The thermoelectric cooling element of claim 20, wherein the path along which the pairs of semiconductors are aligned is a zig-zagging path.

24. A thermoelectric cooling element comprising:
a plurality of thermoelectric units stacked one upon the other, each of said thermoelectric units comprising
a P-type semiconductor and an N-type semiconductor spaced apart from one another,
a first electrical conductor comprising a negative electrode attached to one end of said P-type semiconductor and a positive electrode attached to one end of said N-type semiconductor, and
a second electrical conductor attached to the other ends of said P-type semiconductor and said N-type semiconductor so as to electrically connect the semiconductors; and
a lower, at least one middle and an upper electrically insulating thermoconductor, the lower thermoconductor being attached to the first conductor of a lowermost one of said thermoelectric units at an outer side thereof that faces away from the semiconductors thereof, each said middle thermoconductor being interposed between a respective adjacent pair of the thermoelectric units and attached to the second conductor and to the first conductor of the adjacent thermoelectric units, and the upper thermoconductor being attached to the second conductor of an uppermost one of said thermoelectric units at an outer side thereof that faces away from the semiconductors thereof, whereby the electrically insulating thermoconductors electrically isolate a plurality of parallel conductive paths each extending sequentially through the positive electrode of said first conductor, the N-type semiconductor, the second conductor, the P-type semiconductor, and the negative electrode of said first conductor of a respective said thermoelectric unit.

25. The thermoelectric cooling element of claim 24, and further comprising a heat radiation plate having a plurality of fins attached to said lower thermoconductor on a side thereof facing away from said first conductor of the lowermost one of said thermoelectric units.

26. The thermoelectric cooling element of claim 24, and further comprising an electrical power source electrically connected to the positive and negative electrodes of said first conductor of each of said thermoelectric units so that a closed circuit coincident with said parallel conductive paths is formed.

* * * * *